United States Patent
Momota et al.

(10) Patent No.: US 8,253,222 B2
(45) Date of Patent: Aug. 28, 2012

(54) SEMICONDUCTOR DEVICE AND FABRICATION METHOD OF SEMICONDUCTOR DEVICE

(75) Inventors: Seiji Momota, Nagano (JP); Takeshi Fujii, Nagano (JP); Satoshi Kamijima, Nagano (JP); Makoto Asai, Kariya (JP)

(73) Assignees: Fuji Electric Co., Ltd., Kawasaki-shi (JP); Denso Corporation, Kariya (JP)

( * ) Notice: Subject to any disclaimer, the term of this patent is extended or adjusted under 35 U.S.C. 154(b) by 0 days.

(21) Appl. No.: 13/027,792

(22) Filed: Feb. 15, 2011

(65) Prior Publication Data

US 2011/0204485 A1     Aug. 25, 2011

(30) Foreign Application Priority Data

Feb. 23, 2010 (JP) ................................. 2010-037535

(51) Int. Cl.
H01L 29/41 (2006.01)
(52) U.S. Cl. ........................................ 257/621; 438/430
(58) Field of Classification Search .................. 257/621, 257/E21.54, E29.112; 438/430
See application file for complete search history.

(56) References Cited

U.S. PATENT DOCUMENTS

| 6,545,316 B1* | 4/2003 | Baliga | 257/329 |
| 6,987,305 B2* | 1/2006 | He et al. | 257/417 |
| 7,470,952 B2* | 12/2008 | Ruething et al. | 257/327 |
| 2007/0138548 A1* | 6/2007 | Kocon et al. | 257/336 |

FOREIGN PATENT DOCUMENTS

| JP | 02-083982 A | 3/1990 |
| JP | 5-275705 A | 10/1993 |
| JP | 3197054 B2 | 8/2001 |

OTHER PUBLICATIONS

Japanese Office Action dated Jan. 10, 2012, issued in corresponding Japanese Patemt Application No. 2010-037535.

* cited by examiner

*Primary Examiner* — William D Coleman
*Assistant Examiner* — Christine Enad
(74) *Attorney, Agent, or Firm* — Westerman, Hattori, Daniels & Adrian, LLP

(57) ABSTRACT

A semiconductor device includes a first semiconductor region of a first conductivity type; a second semiconductor region of a second conductivity type, disposed on a surface of the first semiconductor region, and having an impurity concentration higher than that of the first semiconductor region; a trench that penetrates the second semiconductor region to reach the first semiconductor region; a first electrode disposed inside the trench via an insulating film; a first recess portion disposed deeper than an upper end of the first electrode, in a surface layer of the second semiconductor region, so as to be in contact with the trench; and a second electrode embedded in the first recess portion.

3 Claims, 9 Drawing Sheets

SEMICONDUCTOR DEVICE AND FABRICATION METHOD OF SEMICONDUCTOR DEVICE

BACKGROUND OF THE INVENTION

1. Field of the Invention

The present invention relates to a semiconductor device and fabrication method thereof.

2. Description of the Related Art

For electric power converting apparatuses used in electric vehicles (EV), etc., the most widely used insulated gate semiconductor devices have lower power consumption and are easily driven in a voltage-controlled manner. Insulated gate semiconductor devices are known as an insulated gate field effect transistor (metal oxide semiconductor field effect transistor (MOSFET)), an insulated gate bipolar transistor (IGBT), etc.

In the present description and the accompanying drawings, "n" and "p" prefixes of layers and regions indicate that the majority of carriers is an electron and a hole, respectively. "+" and "−" appended to an "n" or a "p" indicate that the impurity concentration is higher and lower, respectively, than layers and regions without "+" and "−".

FIG. 17 is a cross-sectional view of a conventional semiconductor device. For example, MOSFET of a trench gate structure will be described as a conventional insulated gate semiconductor device. A p-type base region 102 is disposed on a surface of a semiconductor substrate forming an $n^-$-type drift region 101. A trench 103 is disposed penetrating the base region 102 and reaching the drift region 101. A gate electrode 105 is disposed inside the trench 103 via a gate insulating film 104. An $n^+$-type source region 106 is selectively disposed on a surface layer of the base region 102 so as to be in contact with the trench 103. A source electrode 108 contacts the base region 102 and the source region 106. The source electrode 108 is electrically insulated from the gate electrode 105 by an interlayer insulating film 107. A drain electrode 109 is disposed on the backside of the semiconductor substrate.

Such a semiconductor device operates as follows. The source electrode 108 is in a state of being connected to the ground or of having a negative voltage applied thereto. The drain electrode 109 is in a state of having a positive voltage applied thereto. If a voltage lower than a threshold value is applied to the gate electrode 105, no current flows between the source and the drain since a p-n junction, made up of the base region 102 and the drift region 101, is inversely-biased. Therefore, the semiconductor device remains in the off-state. On the other hand, if a voltage exceeding the threshold value is applied to the gate electrode 105, in the p-type base region 102, a region in contact with the trench 103 beneath the source region 106 is inverted to become an n-type channel region. This causes an electron leaving the source electrode 108 to travel to the drain electrode 109 through an n-type region consisting of the channel region and the drift region 101 and current flows between the source and the drain, whereby the semiconductor device is turned on.

As such a semiconductor device, an apparatus is proposed that is configured as an insulated gate field effect transistor having a semiconductor substrate of a first conductivity type forming a drain region; a channel region of a second conductivity formed on a principal surface of the semiconductor substrate; a source region formed in the channel region; a gate insulating film and a gate electrode disposed across the source region and the drain region; and a source electrode in contact with a window surrounded by the gate electrode, where in the channel region of the window surrounded by the gate electrode, a recess portion is formed deeper than a channel region surface immediately under the gate insulating film, having a width reaching at least immediately under an end of the gate electrode. A back gate region is introduced into a bottom side region of the recess portion, and a source region of a silicide layer or a metal layer is disposed in the recess portion such that only the channel region and the back gate region are in contact with an inner surface of the source region (see, e.g., Japanese Laid-open Patent Publication No. 3197054).

A method of fabricating the conventional insulated gate semiconductor device depicted in FIG. 17 will be described. The p-type base region 102 is first formed on the surface of the semiconductor substrate forming the $n^-$-type drift region 101. The trench 103 is then formed that penetrates the base region 102 and reaches the drift region 101. The gate electrode 105 is formed inside the trench 103 via the gate insulating film 104. The $n^+$-type source region 106 is selectively formed on the surface layer of the base region 102 so as to be in contact with the trench 103. The interlayer insulating film 107, formed of a film such as phosphosilicate glass (PSG), is selectively formed on the surface of the semiconductor substrate to cover a surface of the gate electrode 105. The source electrode 108 is formed that contacts the base region 102 and the source region 106 exposed on the surface of the semiconductor substrate. The drain electrode 109 in contact with the drift region 101 is formed on the backside of the semiconductor substrate. This completes the MOSFET of the trench gate structure depicted in FIG. 17.

However, in conventional insulated gate semiconductor devices such as MOSFET and IGBT, a parasitic element such as a parasitic bipolar transistor and a parasitic thyristor are incidentally formed in addition to original constituent elements of the semiconductor devices. Such a parasitic element is likely to operate at abnormal times such as when an overcurrent flows in the semiconductor devices. It is problematic that the operation of the parasitic element adversely affects the operation of the original semiconductor devices.

For example, in the semiconductor device depicted in FIG. 17, a parasitic bipolar transistor 121 is formed that is made up of the drift region 101, the base region 102, and the source region 106. If an abnormal current such as overcurrent flows in the semiconductor device and a voltage drop in a channel region exceeds a forward voltage of a silicon diode, which is 0.7 V (because a built-in voltage of the diode is 0.6 V), the parasitic bipolar transistor 121 operates causing latch-up and short circuit. The operation of the parasitic bipolar transistor 121 cannot be controlled by controlling the voltage applied to the gate electrode 105. Therefore, destruction may occur if the semiconductor device exceeds a safe operation range.

A semiconductor device that avoids such a problem is known where size reduction is achieved by forming the source region 106 to have a narrower width, for example. However, the current density in a semiconductor device fabricated in this way is increased by the size reduction and the parasitic bipolar transistor 121 becomes more likely to operate. Another approach is known where the base region 102 of a semiconductor device is formed having a higher impurity concentration. However, a semiconductor device fabricated in this way becomes unable to sufficiently invert the channel region in the on-state. Therefore, the on-voltage problematically increases. Such a problem also occurs in IGBT of the trench gate structure.

To solve the problems of the conventional technologies described above, an object of the present invention is to provide a semiconductor device and fabrication method thereof capable of controlling the influence of a parasitic element. Another object of the present invention is to provide a semiconductor device and fabrication method thereof capable of preventing the on-voltage from increasing.

SUMMARY OF THE INVENTION

It is an object of the present invention to at least solve the above problems in the conventional technologies.

According to one aspect of the present invention, a semiconductor device includes a first semiconductor region of a first conductivity type; a second semiconductor region of a second conductivity type, disposed on a surface of the first semiconductor region, and having an impurity concentration higher than that of the first semiconductor region; a trench that penetrates the second semiconductor region to reach the first semiconductor region; a first electrode disposed inside the trench via an insulating film; a first recess portion disposed deeper than an upper end of the first electrode, in a surface layer of the second semiconductor region, so as to be in contact with the trench; and a second electrode embedded in the first recess portion.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Figure 1:
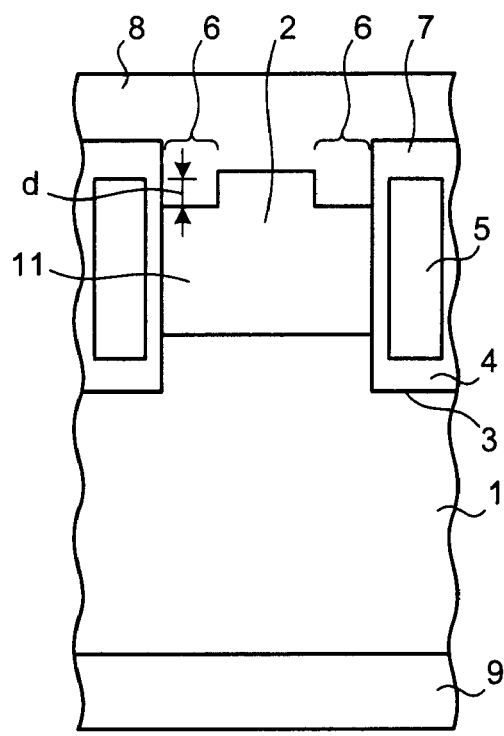
FIG. 1 is a cross-sectional view of a semiconductor device according to an embodiment.

Referring to the accompanying drawings, exemplary embodiments according to the present invention are explained in detail below. With respect to the embodiments and drawings, like components are given the same reference numerals and redundant explanations are omitted.

FIG. 1 is a cross-sectional view of a semiconductor device according to the embodiment. The semiconductor device depicted in FIG. 1 has a p-type (second-conductivity-type) base region 2 disposed on a surface of a semiconductor substrate forming an n⁻-type (first-conductivity-type) drift region 1. The base region 2 has an impurity concentration that is higher than that of the drift region 1. On a surface of the semiconductor substrate, a trench 3 that penetrates the base region 2 to reach the drift region 1 is disposed. In the trench 3, a gate electrode 5 is disposed via a gate insulating film 4. A surface of the gate electrode 5 is covered by an interlayer insulating film 7. The drift region 1 corresponds to a first semiconductor region. The base region 2 corresponds to a second semiconductor region.

A first recess portion 6 is selectively disposed in the surface layer of the base region 2. The base region 2 has an uneven surface shape made up of the first recess portion 6 and a projecting portion without the first recess portion 6. The first recess portion 6 is in contact with the trench 3. The channel region 11 is a region of the base region 2 in contact with the trench 3 under the first recess portion 6. The bottom surface of the first recess portion 6 is disposed deeper from the substrate surface than an interface between the gate electrode 5 and the interlayer insulating film 7 disposed on the upper end of the gate electrode 5 (hereinafter, "upper end of the gate electrode 5"). The reason is as follows. As described later, a source electrode 8 is embedded inside the first recess portion 6. Therefore, the bottom surface of the first recess portion 6 is an interface between the source electrode 8 and the base region 2. If the bottom surface of the first recess portion 6 is positioned shallower from the substrate surface than the upper end of the gate electrode 5, the source electrode 8 disposed in the first recess portion 6 is not formed adjacently to the gate electrode 5 via the gate insulating film 4. As a result, the semiconductor device does not operate.

Preferably, the first recess portion 6 is disposed at a depth equal to or greater than 0.05 μm and equal to or less than 1 μm from the upper end of the gate electrode 5. The reason is as follows. If a first distance d is a depth from the upper end of the gate electrode 5 to the bottom surface of the first recess portion 6 and is less than 0.05 μm, the source electrode 8 disposed in the first recess potion 6 is located adjacent to the gate electrode 5 via the gate insulating film 4 at a shorter distance. Therefore, the operation of the semiconductor device becomes unstable. On the other hand, if the first distance d is greater than 1 μm, the protruding portion of the base region 2 is no longer formed since the width of the first recess portion 6 is broadened corresponding to the depth of the first recess portion 6. This is attributable to a process of forming the first recess portion 6.

The source electrode 8 is in contact with the protruding portion of the base region 2 and is embedded inside the first recess portion 6. Therefore, the source electrode 8 is disposed to cover the base region 2 along the unevenness formed on the surface of the base region 2. The source electrode 8 is electrically insulated from the gate electrode 5 by the interlayer insulating film 7. Although not depicted, a p⁺-type contact region having an impurity concentration higher than that of the base region 2 may be disposed in a surface layer of the protruding portion of the base region 2 so as to be in contact with the first recess portion 6. The source electrode 8 corresponds to a second electrode. A drain electrode 9 is disposed on the backside of the semiconductor substrate.

Figure 2:
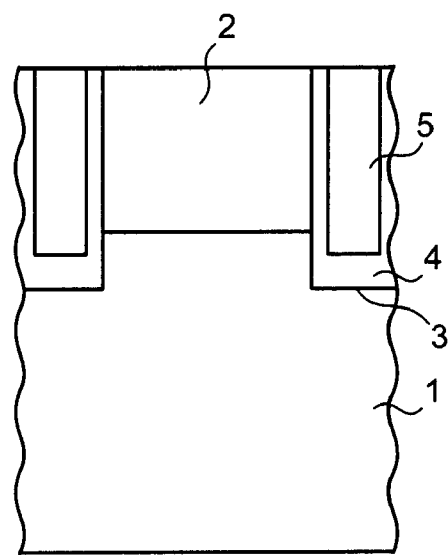
FIGS. 2 to 5 are cross-sectional views of a semiconductor device and depict a fabrication method thereof according to a first embodiment.

A method of fabricating such a semiconductor device will be described. FIGS. 2 to 5 are cross-sectional views of a semiconductor device and depict a fabrication method thereof according to the first embodiment. First, as depicted in FIG. 2, the p-type base region 2 is laid by an epitaxial growth method, for example, on the surface of the semiconductor substrate forming the n⁻-type drift region 1. For example, photolithography is used for forming the trench 3 that penetrates the base region 2 to reach the drift region 1. The gate insulating film 4 made up of a thin silicon dioxide film (SiO₂) is then formed on the side surface and the bottom surface of the trench 3 by a thermal oxidation method, for example. The gate electrode 5 is formed inside the trench 3 via the gate insulating film 4 by embedding polysilicon (Poly-Si), for example.

Figure 3:
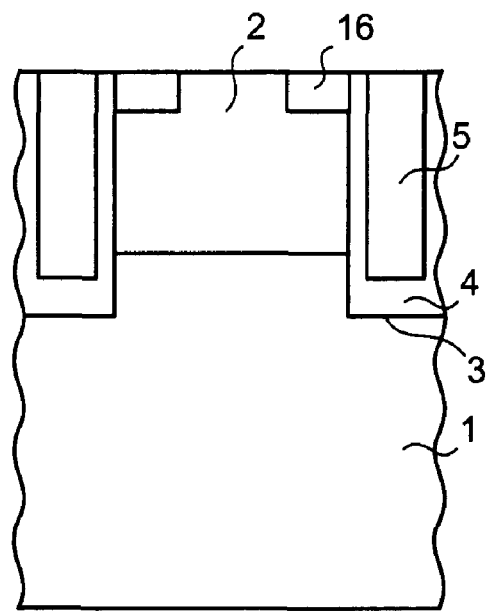

As depicted in FIG. 3, an impurity region 16 is then formed in the surface layer of the base region 2 by introducing an impurity into a region deeper than the upper end of the gate electrode 5. The impurity region 16 is formed with an impurity concentration higher than that of the base region 2 so as to be in contact with the trench 3. Preferably, the impurity region 16 is formed with a depth equal to or greater than 0.05 μm and equal to or less than 1 μm from the upper end of the gate electrode 5. A reason is that the protruding portion of the base region 2 cannot be formed as described above. Another reason is that the impurity concentration of the surface of the impurity region 16 becomes lower than the impurity concentration of the base region 2 if the impurity region 16 is formed deeper than 1 μm from the upper end of the gate electrode 5. The conductivity type of the impurity region 16 may be the n-type or the p-type. The impurity may be introduced by using a thermal diffusion method or an ion implantation method. For example, the $n^+$-type impurity region 16 may be formed in the surface of the p-type base region by ion implantation of phosphorus (P), etc. If a contact region (not depicted) is disposed in the surface layer of the base region 2, the impurity region 16 is formed with an impurity concentration higher than the contact region.

Figure 4:
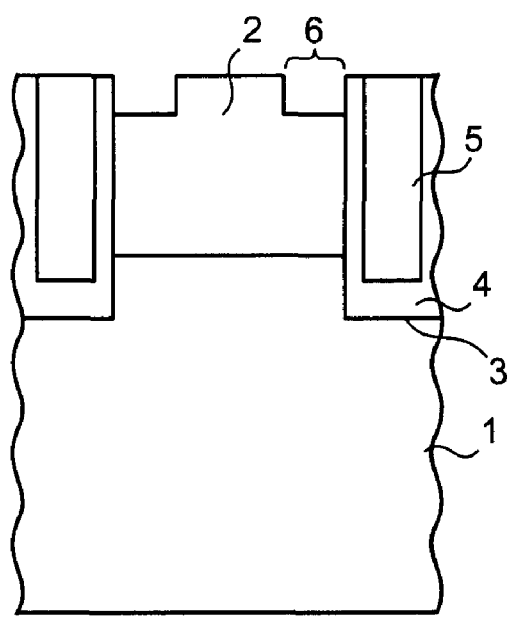

As depicted in FIG. 4, the impurity region 16 is then removed by etching using a mixed acid or aqueous potassium hydroxide solution (KOH) containing hydrofluoric acid (HF) and nitric acid ($HNO_3$), for example. The base region 2 is not removed and remains because of the impurity concentration lower than the impurity region 16. Since the gate insulating film 4 is formed on the sidewall of the trench 3, the gate insulating film 4 and the gate electrode 5 are not removed. Therefore, only the impurity region 16 can be removed by simply performing the etching without selectively forming, for example, a mask on the surface of the base region 2. As a result, the first recess portion 6 in contact with the trench 3 can be formed in the surface layer of the base region 2 such that the protruding portion of the base region 2 remains. The etching may be wet etching or dry etching.

Figure 5:
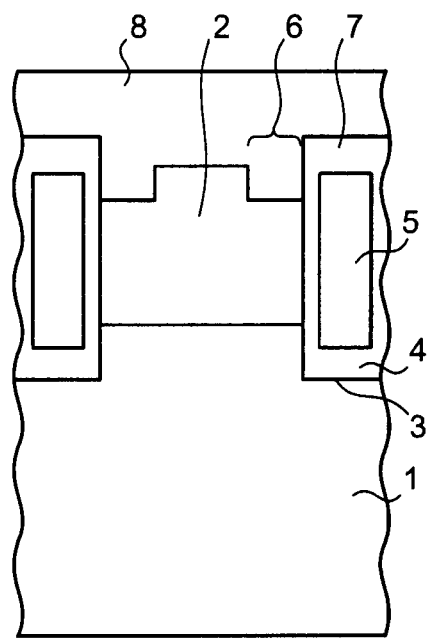

As depicted in FIG. 5, the interlayer insulating film 7, for example, a PSG film, is selectively formed on the surface of the semiconductor substrate to cover the surface of the gate electrode 5. For example, a plating method is used for forming the source electrode 8 that is embedded inside the first recess portion 6 to be in contact with the base region 2 exposed on the substrate surface. The source electrode 8 may be formed by using a chemical vapor deposition (CVD) method or a sputtering method instead of the plating method. Nickel (Ni), tungsten (W), aluminum (Al), etc., may be used as a metal material for the source electrode 8.

The source electrode 8 may have a configuration in which multiple metal electrode layers are laid. In this case, the metal electrode layers forming the source electrode 8 may be laid with formation methods and metal materials variously changed. For example, a tungsten electrode layer may be laid by using the CVD method for the source electrode 8 embedded inside the first recess portion 6 and an aluminum electrode layer may be laid subsequently by using the sputtering method or the plating method for the source electrode 8 formed on the substrate surface. Preferably, at least the metal electrode layer of the bottom layer is formed as a tungsten electrode layer by using the CVD method. This enables a metal material of the source electrode 8 to be accurately embedded in corners, etc., of the bottom surface of the first recess portion 6. Therefore, for example, problems such as peeling of the source electrode 8 can be prevented.

The drain electrode 9 in contact with the drift region 1 is formed on the backside of the semiconductor substrate. This completes the MOSFET of the trench gate structure depicted in FIG. 1.

Figure 17:
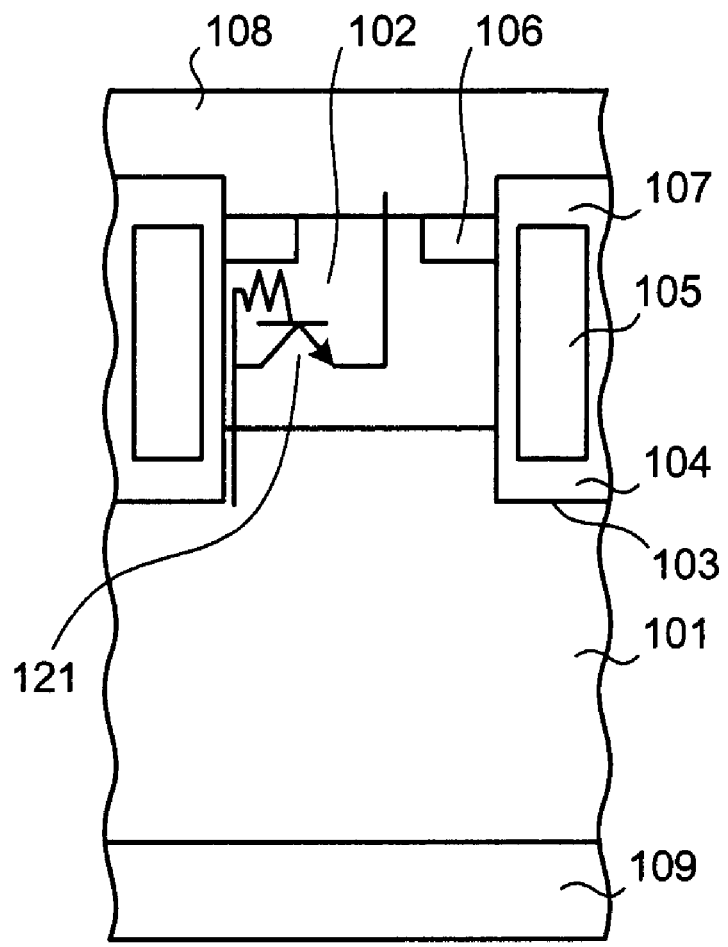
FIG. 17 is a cross sectional view of a conventional semiconductor device.

As described above, according to the first embodiment, the first recess portion 6 deeper than the upper end of the gate electrode 5 is formed in the surface layer of the base region 2 without disposing a source region (the source region 106 of FIG. 17). The source electrode 8 is embedded inside the first recess portion 6. Therefore, a parasitic bipolar transistor (parasitic element) consisting of the drift region 1, the base region 2, and the source region is not formed in the semiconductor device. The semiconductor device operates in a conventional manner. Therefore, the influences of the parasitic element can be controlled. As a result, the semiconductor device can be prevented from being destroyed when an abnormal current flows in the semiconductor device. Since a parasitic element is not formed in the semiconductor device, it is not necessary to increase the impurity concentration of the base region when the semiconductor device is miniaturized. As a result, the channel region can be inverted sufficiently without increasing the on-voltage. Therefore, the on-voltage can be prevented from increasing. In the surface layer of the base region 2, the impurity region 16 is formed deeper than the upper end of the gate electrode 5 with an impurity concentration higher than the base region 2. As a result, only the impurity region 16 formed on the surface layer of the base region 2 can be removed by etching and the first recess portion 6 deeper than the upper end of the gate electrode 5 can be formed in the surface layer of the base region 2. By embedding the source electrode 8 inside the first recess portion 6, the semiconductor device can be fabricated without forming a parasitic element.

Figure 6:
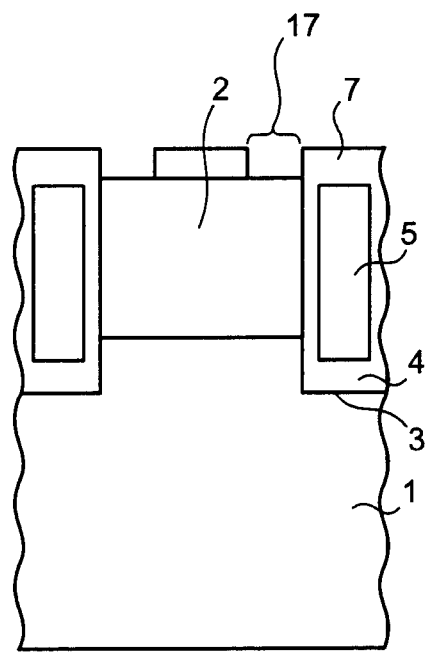
FIGS. 6 and 7 are cross-sectional views of a semiconductor device and depict a fabrication method thereof according to a second embodiment.
Figure 7:
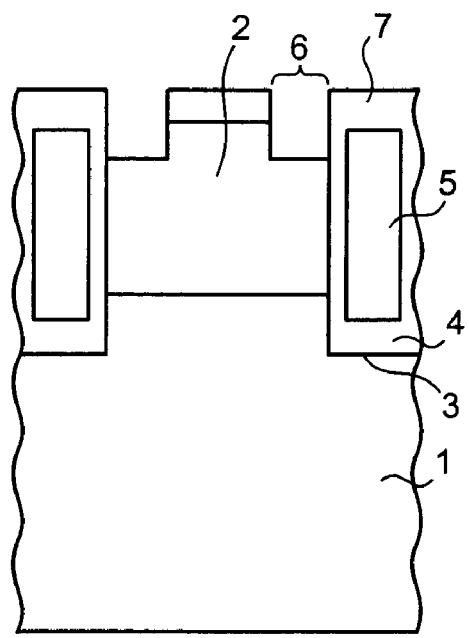

FIGS. 6 and 7 are cross-sectional views of a semiconductor device and depict a fabrication method thereof according to a second embodiment. In the fabrication method according to the first embodiment, the etching may be performed by using the interlayer insulating film 7 as a mask to form the first recess portion 6.

In the second embodiment, as is the case with the first embodiment, the base region 2, the trench 3, the gate insulating film 4, and the gate electrode 5 are formed on the surface of the semiconductor substrate forming the drift region 1 (see FIG. 2). As depicted in FIG. 6, the interlayer insulating film 7 is selectively formed on the surface of the semiconductor substrate. The interlayer insulating film 7 has an opening 17 that exposes a portion of the surface of the base region 2. The interlayer insulating film 7 covers the gate electrode 5. As depicted in FIG. 7, the etching is performed by using the interlayer insulating film 7 as a mask to remove the base region 2 exposed from the opening 17. In this case, the base region 2 is removed to the same depth as the impurity region (see FIGS. 3 and 4) formed in the surface of the base region 2 in the first embodiment. As a result, the first recess portion 6 is formed in the same way as the first embodiment. The interlayer insulating film 7 remaining on the surface of the protruding portion of the base region 2 is removed to leave only the interlayer insulating film 7 covering the gate electrode 5. The source electrode 8 is then formed as is the case with the first embodiment. This leads to the same state as that of a semiconductor device fabricated as depicted in FIG. 5. The subsequent process is performed in the same way as the first embodiment to complete the semiconductor device depicted in FIG. 1. Other arrangements are the same as the first embodiment.

As described above, according to the second embodiment, the same effects as the first embodiment can be achieved.

Figure 8:
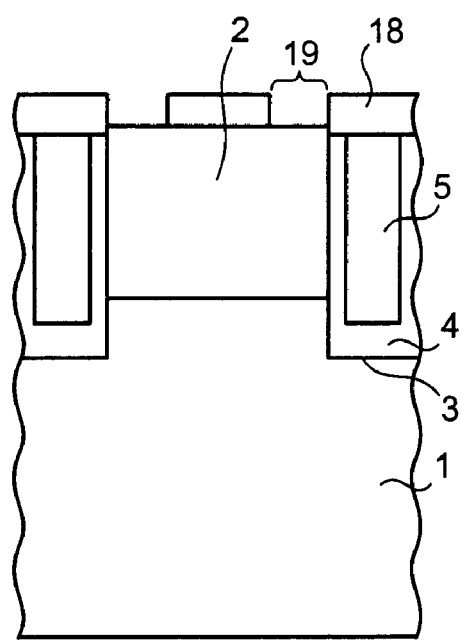
FIGS. 8 and 9 are cross-sectional views of a semiconductor device and depict a fabrication method thereof according to a third embodiment.
Figure 9:
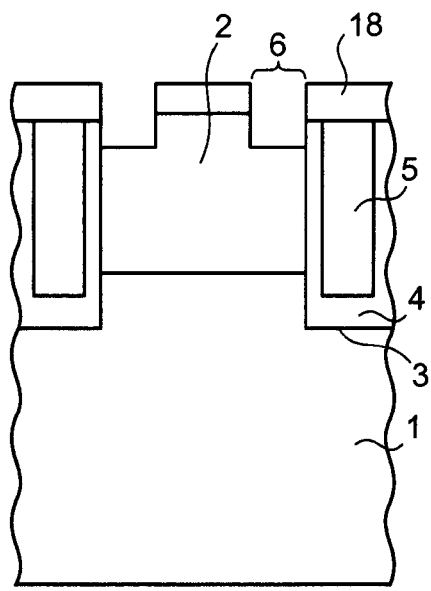

FIGS. 8 and 9 are cross-sectional views of a semiconductor device and depict a fabrication method thereof according to a third embodiment. In the fabrication method according to the first embodiment, the etching may be performed by using a photoresist as a mask to form the first recess portion 6.

In the third embodiment, as is the case with the first embodiment, the base region 2, the trench 3, the gate insulating film 4, and the gate electrode 5 are formed on the surface of the semiconductor substrate forming the drift region 1 (see FIG. 2). As depicted in FIG. 8, a resist make 18 is selectively formed on the surface of the semiconductor substrate. The resist mask 18 has an opening 19 that exposes a portion of the surface of the base region 2. As depicted in FIG. 9, the etching is performed by using the resist mask 18 as a mask to remove the base region 2 exposed from the opening 19. In this case, the base region 2 is removed to the same depth as the impurity region (see FIGS. 3 and 4) formed in the surface of the base region 2 in the first embodiment. As a result, the first recess portion 6 is formed in the same way as the first embodiment. The resist mask 18 is removed completely. This leads to the same state as that of a semiconductor device fabricated as depicted in FIG. 4. The subsequent process is performed in the same way as the first embodiment (see FIG. 5) to complete the semiconductor device depicted in FIG. 1. Other arrangements are the same as the first embodiment. Further, the mask used to form the first recess portion 6 is not limited to the resist mask 18 and another material resistant to etching solution may be used.

As described above, according to the third embodiment, the same effects as the first embodiment can be achieved.

Figure 10:
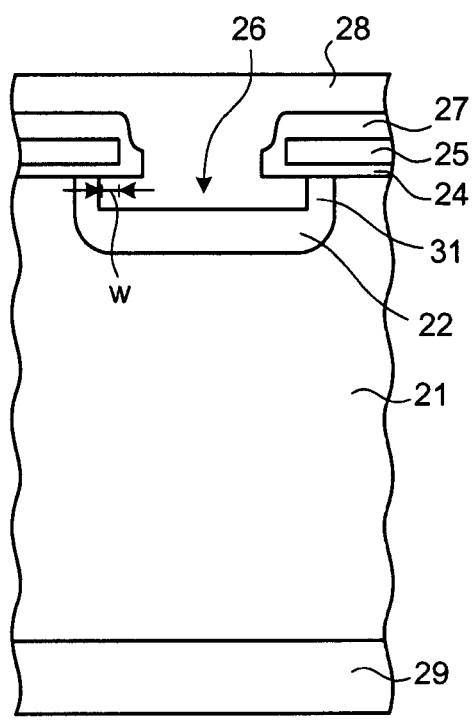
FIG. 10 is a cross-sectional view of a semiconductor device according to a fourth embodiment.

FIG. 10 is a cross-sectional view of a semiconductor device according to a fourth embodiment. In the semiconductor device depicted in FIG. 10, a p-type base region 22 is selectively disposed on a surface layer of a semiconductor substrate acting as an n⁻-type drift region 21. The base region 22 has an impurity concentration higher than that of the drift region 21. The drift region 21 corresponds to a first semiconductor region. The base region 22 corresponds to a second semiconductor region.

A second recess portion 26 is formed in the surface layer of the base region 22. Therefore, the base region 22 has an uneven surface shape made up of the first recess portion 6 and a protruding portion without the first recess portion 6. In the surface of the semiconductor substrate, a gate electrode 25 is disposed via a gate insulating film 24 to cover the protruding portion of the base region 22 and to project into the second recess portion 26. Therefore, the second recess portion 26 is disposed to occupy a portion of a region under the gate electrode 25. Preferably, a second distance w from a sidewall of the second recess portion 26 to a plane encompassing an end of the gate electrode 25 projecting into the second recess portion 26 is equal to or greater than 0.05 μm and equal to or less than 1 μm. The reason is the same as the reason of disposing the first recess portion (see FIG. 1) such that the first distance is achieved in the first embodiment. A channel region 31 is a region of the base region 22 in contact with the gate insulating film 24 under the gate electrode 25. The gate insulating film 24 corresponds to an insulating film. The gate electrode 25 corresponds to a first electrode.

A source electrode 28 is embedded inside the second recess portion 26 and is in contact with the base region 22. The source electrode 28 is electrically insulated from the gate electrode 25 by an interlayer insulating film 27. The source electrode 28 corresponds to a second electrode. A drain electrode 29 is disposed on the backside of the semiconductor substrate.

Figure 11:
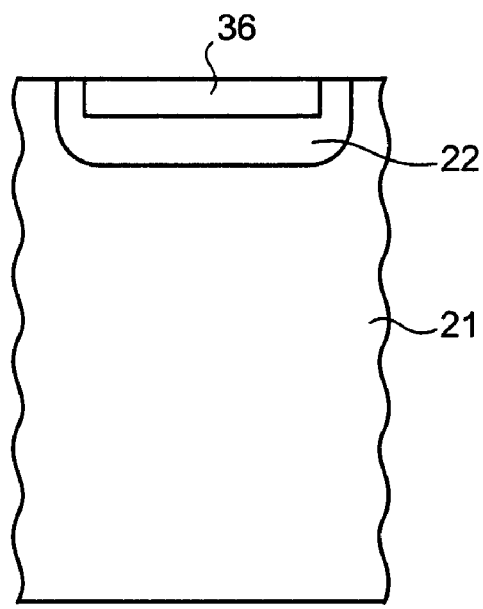
FIGS. 11 to 15 are cross-sectional views of the semiconductor device according to the fourth embodiment and depict a fabrication method thereof.

A method of fabricating such a semiconductor device will be described. FIGS. 11 to 15 are cross-sectional views of the semiconductor device according to the fourth embodiment and depict a fabrication method thereof. First, as depicted in FIG. 11, the p-type base region 22 is selectively formed, by ion implantation of boron (B), for example, on the surface layer of the semiconductor substrate forming the n⁻-type drift region 21. An impurity region 36 is then formed by selectively introducing an impurity into the surface layer of the base region 22. The impurity region 36 is formed to have an impurity concentration higher than that of the base region 22. The conductivity type of the impurity region 36 may be the n-type or the p-type. The formation method of the impurity region 36 is the same as the formation method of the impurity region of the first embodiment.

Figure 12:
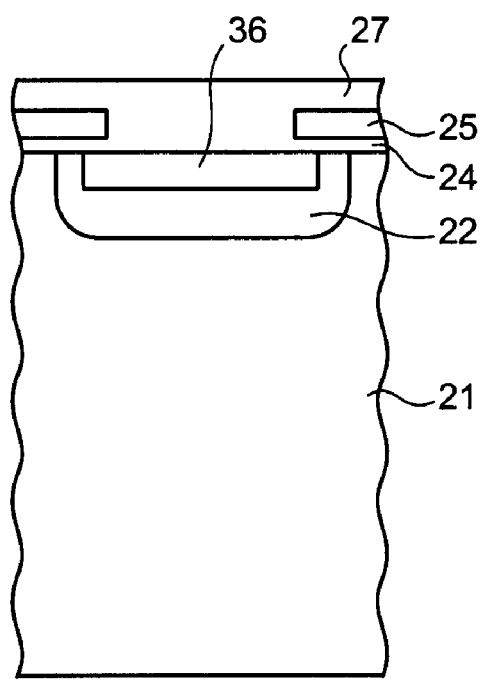
Figure 13:
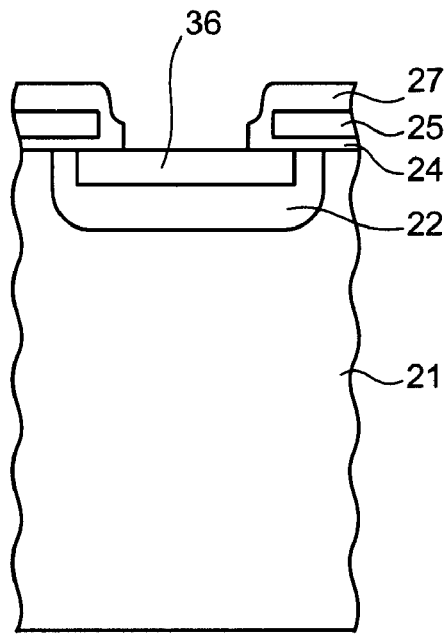

As depicted in FIG. 12, an insulating film forming the gate insulating film 24 is formed on the surface of the semiconductor substrate by a thermal oxidation method, for example. The gate electrode 25 is formed on the surface of the gate insulating film 24 to cover portions of the base region 22 and the impurity region 36 by a sputtering method, for example. The gate electrode 25 is formed such that an end of the gate electrode 25 on the side of the impurity region 36 overlaps an end of the impurity region 36 by a width equal to or greater than 0.05 μm and equal to or less than 1 μm. The surface of the semiconductor substrate is covered by the interlayer insulating film 27 made up of a PSG film, for example. As depicted in FIG. 13, portions of the gate insulating film 24 and the interlayer insulating film 27 are removed by, for example, photolithography to expose a portion of the surface of the impurity region 36.

Figure 14:
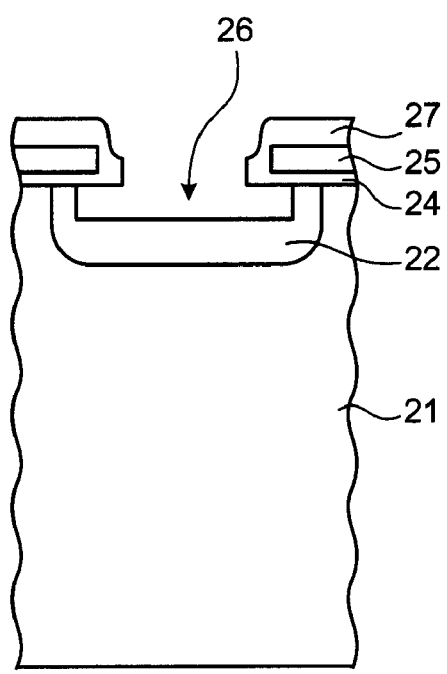
Figure 15:
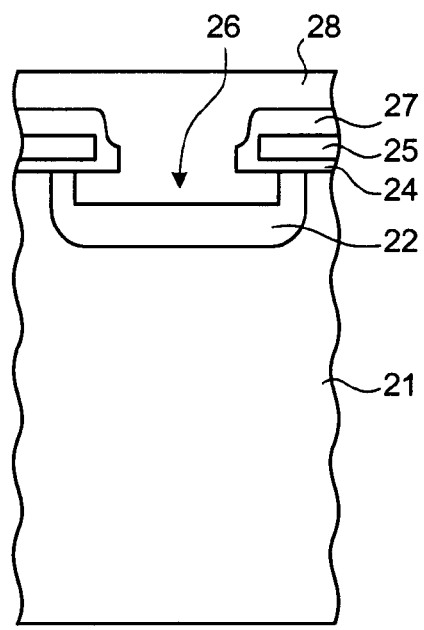

As depicted in FIG. 14, the impurity region 36 is then removed by etching to form the second recess portion 26 in the surface layer of the base region 22. The etching conditions are the same as the first embodiment. As a result, the second recess portion 26 can be formed that occupies the region under the gate electrode 25 with the second distance w equal to or greater than 0.05 μm and equal to or less than 1 μm. As depicted in FIG. 15, the source electrode 28 is embedded inside the second recess portion 26. The formation method of the source electrode 28 is the same as the first embodiment. The drain electrode 29 in contact with the drift region 21 is formed on the backside of the semiconductor substrate. This completes the MOSFET of the planar structure depicted in FIG. 10.

As described above, according to the fourth embodiment, the second recess portion 26 is disposed in the surface layer of the base region 22 to occupy a portion of the region under the gate electrode 25 without disposing the source region. The source electrode 28 is embedded inside the second recess portion 26. As a result, the same effects as the first embodiment can be acquired. The impurity region 36 having an impurity concentration higher than that of the base region 22 is formed in the surface layer of the base region 22 and the gate electrode 25 is formed to cover a portion of the impurity region 36. As a result, the etching can be performed to form the second recess portion 26 occupying a portion of the region under the gate electrode 25 in the surface layer of the base region 22, and the same effects as the first embodiment can be achieved.

Figure 16:
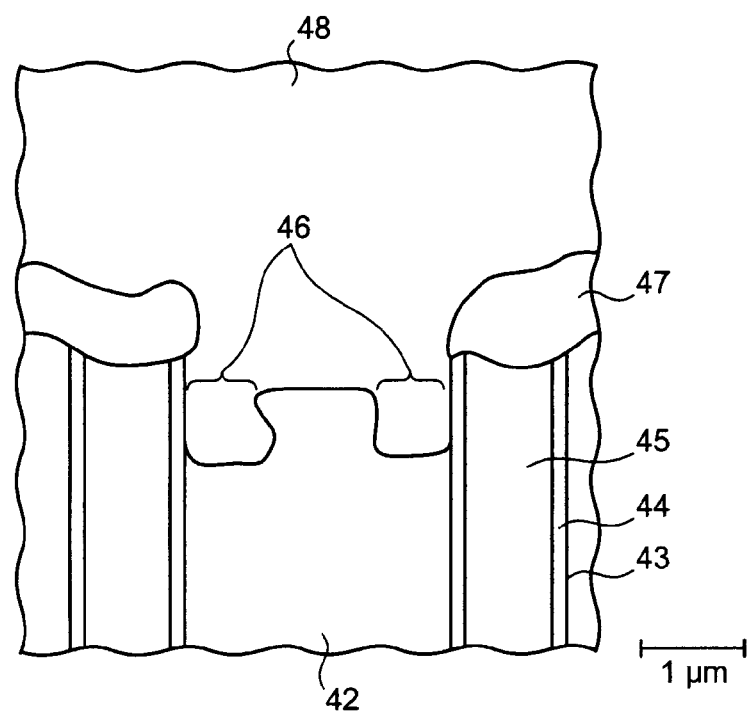
FIG. 16 is a conceptual diagram schematically depicting a cross-section of a semiconductor device of the embodiments.

FIG. 16 is a conceptual diagram schematically depicting a cross-section of a semiconductor device of the embodiments. The semiconductor device of the trench gate structure was fabricated according to the fabrication method according to the first embodiment. First, a trench 43 was formed that penetrates a base region 42 to reach a drift region (not depicted). A depth and a width of the trench 43 were set to 5 µm and 1.2 µm, respectively. The distance between the trenches 43 was set to 2.8 µm. A gate electrode 45 was formed inside the trench 43 via a gate insulating film 44. An impurity region (not depicted) was formed in the surface layer of the base region 42.

Etching was then performed. It was found that the etching can remove only the impurity region (not depicted) formed in the surface layer of the base region 42 to form a first recess portion 46 as depicted in FIG. 16. A plating method was subsequently used for plating of nickel to form a source electrode 48. It was found that the source electrode 48 can be embedded inside the first recess portion 46 as depicted in FIG. 16. The source electrode 48 and the gate electrode 45 were insulated by an interlayer insulating film 47. The operation of the semiconductor device fabricated in this way was then checked. It was found that the semiconductor device operates in the same way as conventional semiconductor devices.

In the embodiments described above, IGBT of the trench gate structure may be formed by disposing a p-type collector region having an impurity concentration higher than that of a drift region, between the drift region and a backside electrode. In this case, a parasitic thyristor (parasitic element) consisting of the collector region, the drift region, the base region, and the emitter region is not formed. Therefore, the same effects as the embodiments described above can be acquired. The backside electrode is a collector electrode. The collector electrode corresponds to a third electrode. The collector region corresponds to a third semiconductor region.

Although the present invention has been described with an example of a circuit having a configuration in which one semiconductor device is disposed on a semiconductor substrate, the present invention is applicable not only to the embodiments described above but also to an integrated circuit (IC) having a configuration in which a plurality of semiconductor devices is disposed on the same substrate. The n-type and the p-type of the regions of the semiconductor device may be configured to be entirely reversed.

According to the invention described above, the second recess portion is disposed in the surface layer of the second semiconductor region to occupy a portion of a region under the first electrode without disposing the source region. The second electrode is embedded inside the second recess portion. Therefore, a parasitic bipolar transistor (parasitic element) consisting of the first semiconductor region, the second semiconductor region, and the source region is not formed in the semiconductor device. The semiconductor device operates in a conventional manner.

According to the invention, an emitter region is not disposed in the surface layer of the second semiconductor region. Therefore, a parasitic thyristor (parasitic element) consisting of the third semiconductor region, the first semiconductor region, the second semiconductor region, and the emitter region is not formed. The semiconductor device operates in a conventional manner.

According to the invention, since no parasitic element is formed in the semiconductor device, it is not necessary to increase the impurity concentration of the second semiconductor region when the semiconductor device is reduced in size. Therefore, the channel region can be inverted sufficiently without increasing the on-voltage.

According to the invention, in the surface layer of the second semiconductor region, the impurity region is formed deeper than the upper end of the first electrode and has an impurity concentration higher than the second semiconductor region. As a result, only the impurity region can be removed by etching and the first recess portion deeper than the upper end of the first electrode can be formed in the surface layer of the second semiconductor region. By embedding the second electrode inside the first recess portion, the semiconductor device can be fabricated without forming a parasitic element.

According to the invention, in the surface layer of the second semiconductor region, the impurity region is formed of an impurity concentration higher than that of the second semiconductor region and the first electrode is formed to cover a portion of the impurity region. As a result, only the impurity region can be removed by etching and the second recess portion occupying a portion of a region under the first electrode can be formed in the surface layer of the second semiconductor region. By embedding the second electrode inside the second recess portion, the semiconductor device can be fabricated without forming a parasitic element.

As described above, the semiconductor device and the method of fabricating the semiconductor device according to the present invention are useful in the fabrication of high-power semiconductor devices and are particularly suitable in the fabrication of insulated gate semiconductor devices such as MOSFET and IGBT.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

This application is based upon and claims the benefit of priority of the prior Japanese Patent Application No. 2010-037535, filed on Feb. 23, 2010, the entire contents of which are incorporated herein by reference.

What is claimed is:

1. A semiconductor device comprising:
   a first semiconductor region of a first conductivity type;
   a second semiconductor region of a second conductivity type, disposed on a surface of the first semiconductor region, and having an impurity concentration higher than that of the first semiconductor region;
   a trench that penetrates the second semiconductor region to reach the first semiconductor region;
   a first electrode disposed inside the trench via an insulating film;
   a first recess portion disposed deeper than an upper end of the first electrode, in a surface layer of the second semiconductor region, so as to be in direct contact with the trench;
   a protruding portion that is formed by a plurality of the first recess portions in the surface layer of the second semiconductor region;
   a second electrode embedded in the first recess portion;
   a third electrode disposed on a backside of the first semiconductor region, and
   a third semiconductor region of the second conductivity type, disposed between the first semiconductor region and the third electrode, and having an impurity concentration higher than the first semiconductor region,
   wherein the first recess portion is disposed having a depth equal to or greater than 0.05 µm and equal to or less than 1 µm from the upper end of the first electrode.

2. A semiconductor device comprising:
   a first semiconductor region of a first conductivity type;
   a second semiconductor region of a second conductivity type, selectively disposed on a surface of the first semiconductor region, and having an impurity concentration higher than that of the first semiconductor region;

a first electrode disposed via an insulating film to cover a portion of a surface of the second semiconductor region;
a second recess portion disposed in a surface layer of the second semiconductor region so as to occupy a portion of a region under the first electrode; and
a second electrode embedded in the second recess portion
wherein the second recess portion occupies the region under the first electrode by a width equal to or greater than 0.05 µm and equal to or less than 1 µm from an end of the first electrode on the side of the second recess portion.

3. The semiconductor device according to claim 2, further comprising:
a third electrode disposed on a backside of the first semiconductor region, and
a third semiconductor region of the second conductivity type, disposed between the first semiconductor region and the third electrode, and having an impurity concentration higher than the first semiconductor region.

* * * * *